US010629120B2

(12) United States Patent
Zhou

(10) Patent No.: US 10,629,120 B2
(45) Date of Patent: Apr. 21, 2020

(54) PIXEL CIRCUIT AND DRIVING METHOD THEREOF, DISPLAY DEVICE

(71) Applicant: KunShan Go-Visionox Opto-Electronics Co., Ltd., Kunshan (CN)

(72) Inventor: Zhiyi Zhou, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 0 days.

(21) Appl. No.: 16/382,822

(22) Filed: Apr. 12, 2019

(65) Prior Publication Data

US 2019/0267435 A1 Aug. 29, 2019

Related U.S. Application Data

(63) Continuation of application No. PCT/CN2018/091680, filed on Jun. 15, 2018.

(30) Foreign Application Priority Data

Jun. 15, 2018 (CN) .......................... 2017 1 1049040

(51) Int. Cl.

| | |
|---|---|
| ***H01L 27/32*** | (2006.01) |
| ***H01L 27/12*** | (2006.01) |
| ***H01L 51/52*** | (2006.01) |
| ***G09G 3/3225*** | (2016.01) |
| ***G09G 3/3208*** | (2016.01) |
| ***G09G 3/3258*** | (2016.01) |
| ***G09G 3/3241*** | (2016.01) |

(52) U.S. Cl.

CPC ......... *G09G 3/3225* (2013.01); *G09G 3/3208* (2013.01); *G09G 3/3241* (2013.01); *G09G 3/3258* (2013.01)

(58) Field of Classification Search

CPC .. G09G 3/3225; G09G 3/3208; G09G 3/3241; G09G 3/3258

See application file for complete search history.

(56) References Cited

U.S. PATENT DOCUMENTS

2014/0292827 A1* 10/2014 Kang ........................ G09G 3/20 345/690

2017/0148384 A1 5/2017 Lee et al.

FOREIGN PATENT DOCUMENTS

| | | | |
|---|---|---|---|
| CN | 104064143 | A | 9/2014 |
| CN | 104103239 | A | 10/2014 |
| CN | 105336292 | A | 2/2016 |
| CN | 106097964 | A | 11/2016 |

(Continued)

OTHER PUBLICATIONS

International Search Report dated Sep. 18, 2018 in corresponding International Application No. PCT/CN2018/091680; 11 pages; English translation of category of relevancy attached.

*Primary Examiner* — Wing H Chow

(74) *Attorney, Agent, or Firm* — Maier & Maier, PLLC

(57) ABSTRACT

A pixel circuit and a driving method thereof, a display device are provided. The pixel circuit includes a first through eighth thin film transistors, a first capacitor, a second capacitor, and a light emitting diode. In the pixel circuit provided by the embodiment of the application, a compensation voltage provided by a compensation voltage signal line can partially compensate a supply voltage during an emission stage of the pixel circuit.

16 Claims, 1 Drawing Sheet

(56) References Cited

FOREIGN PATENT DOCUMENTS

| | | | |
|---|---|---|---|
| CN | 106960656 | A | 7/2017 |
| KR | 100719678 | B1 | 5/2007 |
| TW | 201730867 | A | 9/2017 |

* cited by examiner

PIXEL CIRCUIT AND DRIVING METHOD THEREOF, DISPLAY DEVICE

FIELD

The application relates to a display technical field, and more particularly to a pixel circuit and a driving method thereof, a display device.

BACKGROUND

An organic light emitting display device is a display device using an organic light emitting diode (OLED) as a light emitting device with the characteristics of high contrast, thin thickness, wide viewing angle, fast response speed, low power consumption, etc., and is increasingly applied to various displaying and illuminating field.

In an existing organic light emitting display device, a plurality of pixel circuits may be generally included. The plurality of pixel circuits are generally supplied with a supply voltage by a same power source. A current flowing through the light emitting diodes (LEDs) in the pixel circuit may be determined by the supply voltage.

However, in practical applications, when the supply voltage is transmitted between the plurality of pixel circuits, an internal resistance (IR) drop is inevitably generated, resulting in a difference in the actual supply voltage of each pixel circuit, thereby causing a difference in current flowing through each of the light emitting diodes, and an uneven brightness of the display device.

SUMMARY

The main purpose of the application is to provide a pixel circuit and a driving method thereof, a display device, which are intended to solve the problem that in the existing display device, the brightness of the display device is uneven due to the difference in current flowing through the light emitting diode caused by the supply voltage drop.

To achieve the above purpose, the application provides a pixel circuit including: a first thin film transistor, a second thin film transistor, a third thin film transistor, a fourth thin film transistor, a fifth thin film transistor, a sixth thin film transistor, a seventh thin film transistor, an eighth thin film transistor, a first capacitor, a second capacitor, and a light emitting diode, wherein:

a gate of the first thin film transistor is respectively connected to a source of the third thin film transistor, a source of the fourth thin film transistor, a first end of the first capacitor and a first end of the second capacitor; a drain of the fourth thin film transistor is connected to a reference voltage signal line; a second end of the first capacitor is respectively connected to a drain of the seventh thin film transistor and a drain of the eighth thin film transistor; a source of the seventh thin film transistor is connected to a compensation voltage signal line, and a second end of the second capacitor is connected to the control signal line;

a source of the first thin film transistor is respectively connected to a drain of the second thin film transistor, a drain of the fifth thin film transistor, and a source of the eighth thin film transistor; a source of the second thin film transistor is connected to a data voltage signal line, and a source of the fifth thin film transistor is connected to a first power source;

a drain of the first thin film transistor is respectively connected to a drain of the third thin film transistor and a source of the sixth thin film transistor, and a drain of the sixth thin film transistor is connected to an anode of the light emitting diode, and a cathode of the light emitting diode is connected to a second power source.

Optionally, the first power source supplies a supplies voltage to the first thin film transistor; and a current flows into the second power source when the light emitting diode emits light.

Optionally, the reference voltage signal line provides a reference voltage, the reference voltage is a negative voltage initializing the gate of the first thin film transistor;

the control signal line provides a control signal, the control signal provides an alternating voltage changing a voltage of the second end of the second capacitor.

Optionally, the compensation voltage signal line provides a compensation voltage for partially compensating for the supply voltage provided by the first power source.

Optionally, the compensation voltage is a positive voltage greater than the supply voltage provided by the first power source; or the compensation voltage is a negative voltage, and the compensation voltage and the reference voltage provided by the reference signal line are provided by a same power source.

Optionally, a gate of the fourth thin film transistor is connected to a first scanning line, and the first scanning line provides a first scanning signal controlling the fourth thin film transistor to be in an on-state, and initializing the gate of the first thin film transistor;

a gate of the second thin film transistor, a gate of the third thin film transistor, and a gate of the seventh thin film transistor are connected to a second scanning line, and the second scanning line provides a second scanning signal controlling the second thin film transistor, the third thin film transistor, and the seventh thin film transistor to be in an on-state, and compensating a threshold voltage of the first thin film transistor;

a gate of the fifth thin film transistor, a gate of the sixth thin film transistor, and a gate of the eighth thin film transistor are connected to an emission control line, and the emission control line provides an emission control signal controlling the fifth thin film transistor, the sixth thin film transistor, and the eighth thin film transistor to be in an on-state, the current flows through the light emitting diode.

Optionally, when the second scanning signal controls the seventh thin film transistor to be in an on-state, the compensation voltage signal line is connected to the second end of the first capacitor, and the compensation voltage applies a voltage to the first capacitor;

when the light emitting control signal controls the fifth thin film transistor and the eighth thin film transistor to be in an on-state, the first power source is connected to the second end of the first capacitor through the fifth thin film transistor and the eighth thin film transistor; under an action of the first capacitor and the second capacitor, a voltage flowing through the light emitting diode is related to the compensation voltage and the first power source, and partially compensate for the first power source.

Optionally, the control signal line connected to the second end of the second capacitor is a second scanning line.

Optionally, a capacitance value of the first capacitor is greater than a capacitance value of the second capacitor.

Optionally, the capacitance value of the first capacitor is between ten times and one hundred times of the capacitance value of the second capacitor.

Optionally, the first thin film transistor is a P-type thin film transistor.

Optionally, the second thin film transistor, the third thin film transistor, the fourth thin film transistor, the fifth thin film transistor, the sixth thin film transistor, the seventh thin film transistor, and the eighth thin film transistor are all N-type thin film transistors or all P-type thin film transistors.

Optionally, at least one of the second thin film transistor, the third thin film transistor, the fourth thin film transistor, the fifth thin film transistor, the sixth thin film transistor, the seventh thin film transistor, and the eighth thin film transistor is a P-type thin film transistor.

An embodiment of the application provides a pixel circuit driving method which is intended for driving the pixel circuit mentioned above, the pixel circuit driving method including:

in a first stage, a first scanning signal controlling a fourth thin film transistor to change from an off-state to an on-state, a reference voltage provided by a reference voltage signal line initializing a gate of a first thin film transistor, a first end of a first capacitor, and a first end of a second capacitor, a second scanning signal controlling a second thin film transistor, a third thin film transistor and a seventh thin film transistor to be in an off-state, an emission control signal controlling a fifth thin film transistor, a sixth thin film transistor, and an eighth thin film transistor to be in an off-state, and a control signal line applying a high level to a second end of the second capacitor;

in a second stage, the first scanning signal controlling the fourth thin film transistor to change from the on-state to the off-state, the second scanning signal controlling the second thin film transistor, the third thin film transistor, and the seven thin film transistor to change from the off-state to the on-state, and compensating for a threshold voltage of the first thin film transistor, a compensation voltage provided by a compensation voltage signal line applying a voltage to a second end of the first capacitor; the emission control signal controlling the fifth thin film transistor, the sixth thin film transistor and the eighth thin film transistor to be in the off-state, and the control signal line applying a low level to the second end of the second capacitor;

in a third stage, the first scanning signal controlling the fourth thin film transistor to be in the off-state, the second scanning signal controlling the second thin film transistor, the third thin film transistor, and the seventh thin film transistor to change from the on-state to the off-state, the emission control signal controlling the fifth thin film transistor, the sixth thin film transistor, and the eighth thin film transistor to change from the off-state to the on-state, wherein, the light emitting diode emits light, and the control signal line applies a high level to the second end of the second capacitor.

Optionally, in the third stage, under the action of the first capacitor and the second capacitor, a voltage flowing through the light emitting diode is related to the compensation voltage and the first power source, partially compensating the first power source.

An embodiment of the application also provides a display device, including the pixel circuit mentioned above.

The following beneficial effects can be achieved by at least one of the above technical solutions adopted by the embodiments of the application:

In the pixel circuit provided by the embodiment of the application, the compensation voltage provided by the compensation voltage signal line can partially compensate the supply voltage during the emission stage of the pixel circuit, so that the current flowing through the LED is determined by the compensation voltage and the supply voltage. The influence of the supply voltage drop on the current flowing through the LED can be further reduced to a certain extent, thereby reducing the influence of the supply voltage drop on the display unevenness of the display device.

In addition, the pixel circuit provided by the embodiment of the application can further compensate the threshold voltage of the driving thin film transistor, thus the problem that the display unevenness of the display device due to the difference in threshold voltage of the driving thin film transistor can be effectively avoided.

The implementation, functional features and advantages of the purpose of the application will be further described with reference to the accompanying drawings.

DETAILED DESCRIPTION

The embodiments of the application provide a pixel circuit and a driving method thereof, a display device. A compensation voltage signal line is added to the pixel circuit. The compensation voltage provided by the compensation voltage signal line can partially compensate the supply voltage in a light emitting stage of the pixel circuit, so that the current flowing through the LED is determined by both the compensation voltage and the supply voltage, which can reduce the influence of the supply voltage drop on the current flowing through the LED to a certain extent, thereby reducing the influence of the supply voltage drop on the display non-evenness of the display device.

The technical solutions of the application will be clearly and fully described below in conjunction with the specific embodiments of the application and the corresponding drawings.

It should be noted that, in the pixel circuit provided by the embodiment of the application, the first thin film transistor is a driving thin film transistor, specifically, a P-type thin film transistor; the second thin film transistor, the third thin film transistor, and the fourth thin film transistor, the fifth thin film transistor, the sixth thin film transistor, the seventh thin film transistor, the eighth thin film transistor may all be P-type thin film transistors or may all be N-type thin film transistors, or at least one of them may be a P-type thin film transistor, and the rest of them may be N-type thin film transistors, which is not specifically limited in the embodiment of the application.

The light emitting diode may be an LED or an OLED, and is not specifically limited herein.

The technical solutions provided by the embodiments of the application will be described in detail below with reference to the accompanying drawings.

Figure 1:
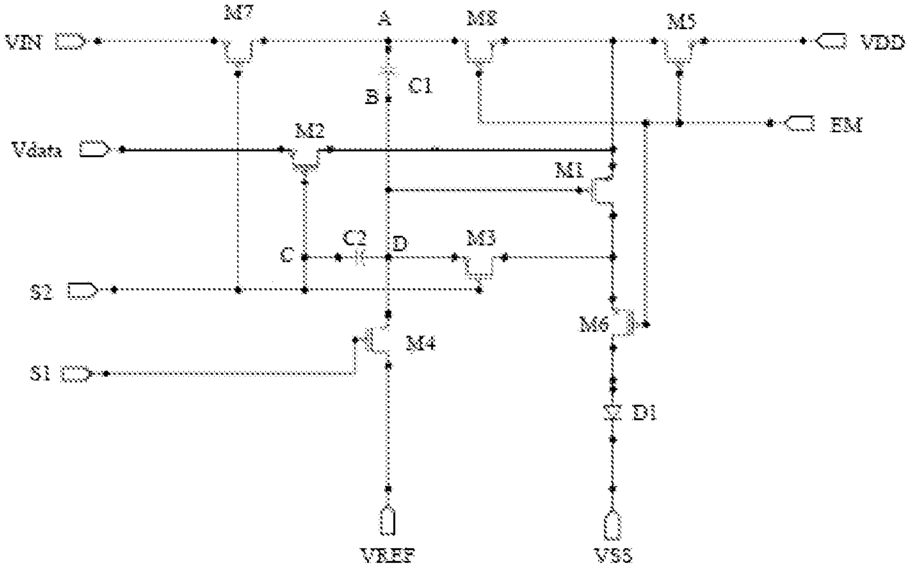
FIG. 1 is a schematic structural view of a pixel circuit according to an embodiment of the application.

FIG. 1 is a schematic structural diagram of a pixel circuit according to an embodiment of the application. The pixel circuit is as follows.

As shown in FIG. 1, the pixel circuit includes a first thin film transistor M1, a second thin film transistor M2, a third thin film transistor M3, a fourth thin film transistor M4, a fifth thin film transistor M5, a sixth thin film transistor M6, and a seventh thin film transistor M7, an eighth thin film transistor M8, a first capacitor C1, a second capacitor C2, and a light emitting diode D1.

In the pixel circuit shown in FIG. 1, the first thin film transistor M1, the second thin film transistor M2, the third thin film transistor M3, the fourth thin film transistor M4, the fifth thin film transistor M5, the sixth thin film transistor M6, the seventh thin film transistor M7, and the eighth thin film transistor M8 are all P-type thin film transistors, and the light emitting diode D1 is an OLED.

The circuit connection structure of the pixel circuit shown in FIG. 1 is as follows:

A gate of the first thin film transistor M1 is respectively connected to a source of the third thin film transistor M3, a source of the fourth thin film transistor M4, and a first end of the first capacitor C1 (point B shown in FIG. 1, a lower electrode plate of the first capacitor C1) and a first end of the second capacitor C2 (point D shown in FIG. 1, a right electrode plate of the second capacitor C2); a source of the first thin film transistor M1 is connected to a drain of the second thin film transistor M2, a drain of the fifth thin film transistor M5 and a source of the eighth thin film transistor M8, respectively; and a drain of the first thin film transistor M1 is connected to a drain of the third thin film transistor M3 and a source of the sixth thin film transistor M6, respectively;

A source of the second thin film transistor M2 is connected to a data voltage signal line;

a drain of the fourth thin film transistor M4 is connected to a reference voltage signal line;

a source of the fifth thin film transistor M5 is connected to a first power source VDD;

a drain of the sixth thin film transistor M6 is connected an anode of the LED D1;

a source of the seventh thin film transistor M7 is connected to a compensation voltage signal line, and a drain of the seventh thin film transistor M7 is respectively connected to a drain of the eighth thin film transistor M8 and a second end of the first capacitor C1 (point A shown in FIG. 1, an upper electrode plate of the first capacitor C1);

A cathode of the light emitting diode D1 is connected to a second power source VSS.

It should be noted that, in practical applications, the third thin film transistor M3 shown in FIG. 1 may be replaced by two common-gate thin film transistors, so that during the operation of the pixel circuit, the two common-gate thin film transistors can reduce a leakage current of a branch where the third thin film transistor M3 is located. Similarly, the fourth thin film transistor M4 can also be replaced by two common-gate thin film transistors to reduce a leakage current of a branch where the fourth thin film transistor M4 is located. In addition, for other thin film transistors in FIG. 1 which can be regarded as switching transistors, one or more thin film transistors therein can be replaced by two common-gate thin film transistors respectively according to actual requirements, so as to reduce the leakage current of corresponding branches, which is not specifically limited in the embodiment of the application.

In the embodiment of the application, the first power source VDD may be a positive voltage, and is used to supply a supply voltage to the first thin film transistor M1. The first thin film transistor M1 may output current under an action of the first power source VDD. The current flows into the light emitting diode D1 and causes the light emitting diode D1 to emit light. When the light emitting diode D1 emits light, the current flows into the second power source VSS. The second power source VSS may be a negative voltage.

The data voltage signal line can be used to provide a data voltage Vdata. The reference voltage signal line can be used to provide a reference voltage VREF. In the embodiment of the application, the reference voltage VREF may be a negative voltage, and be used to initialize the gate of the first thin film transistor M1.

The compensation voltage signal line can provide a compensation voltage VIN that can be used to partially compensate the supply voltage provided by the first power source VDD.

It should be noted that, in the embodiment of the application, the compensation voltage VIN may be a positive voltage or a negative voltage. When the compensation voltage VIN is positive, the compensation voltage VIN may be greater than the first power source VDD; when the compensation voltage VIN is negative, the compensation voltage VIN and the reference voltage VREF may be provided by a same power source, that is, the compensation voltage signal line and the reference voltage signal line may be combined into one signal line. At this time, the data voltage Vdata may be a negative voltage which can be smaller than the compensation voltage VIN.

In the pixel circuit shown in FIG. 1, S1 is a first scanning signal provided by a first scanning line, S2 is a second scanning signal provided by a second scanning line, and EM is an emission control signal provided by an emission control line, wherein:

a gate of the fourth thin film transistor M4 is connected to the first scanning line, and the first scanning signal S1 provided by the first scanning line can control the fourth thin film transistor M4 to be in an on-state or an off-state;

a gate of the second thin film transistor M2, a gate of the third thin film transistor M3 and a gate of the seventh thin film transistor M7 are connected to the second scanning line; the second scanning signal S2 provided by the second scanning line can control the second thin film transistor M2, the third thin film transistor M3, and the seventh thin film transistor M7 to be in an on-state or an off-state;

a gate of the fifth thin film transistor M5, a gate of the sixth thin film transistor M6, and a gate of the eighth thin film transistor M8 are connected to the emission control line, and the emission control signal EM provided by the emission control line can control the fifth film transistor M5, the sixth thin film transistor M6, and the eighth thin film transistor M8 to be in an on-state or an off-state.

In the embodiment of the application, a second end of the second capacitor C2 (the point C shown in FIG. 1, a left electrode plate of the second capacitor C2) may also be connected to the second scanning line, and the second scanning signal S2 may be used to change the voltage of the second end of the second capacitor C2 (i.e., the left electrode plate voltage of the second capacitor C2), wherein the second scanning signal S2 can provide an alternating voltage, that is, the second scanning signal S2 can be changed from a high level to a low level, and from a low level to a high level, in order to change the voltage of the left electrode plate of the second capacitor C2.

It should be noted that, in practical applications, the line connected to the second end C of the second capacitor C2 in FIG. 1 may be an other control signal line, wherein the control signal line may provide a control signal which can provide an alternating voltage and have a voltage variation characteristic of the second scanning signal S2. The control signal may be used to change the voltage of the left electrode plate of the second capacitor C2. In an embodiment of the application, as a preferred manner, the second end C of the second capacitor C2 may be connected to the second scanning line to reduce the number of control lines in the pixel circuit.

In the embodiment of the application, when the first scanning signal S1 controls the fourth thin film transistor M4 to be in an on-state, the reference voltage VREF may apply a voltage to the gate of the first thin film transistor M1 through the fourth thin film transistor M4, and initialize the gate of the first thin film transistor M1.

When the second scanning signal S2 controls the second thin film transistor M2, the third thin film transistor M3, and the seventh thin film transistor M7 to be in an on-state, for the first thin film transistor M1, the gate and the drain of the first thin film transistor M1 are connected to each other, the data voltage Vdata applies the voltage to the source of the first thin film transistor M1 through the second thin film transistor M2. After the state of the circuit is stabilized, the source voltage of the first thin film transistor M1 is Vdata, and the gate voltage and the drain voltage are both Vdata−Vth. In this way, the compensation of a threshold voltage of the first thin film transistor M1 can be achieved, wherein Vth is the threshold voltage of the first thin film transistor M1.

For the first capacitor C1, the compensation voltage VIN may apply voltage to the upper electrode plate of the first capacitor C1 (point A shown in FIG. 1) through the seventh thin film transistor M7, so that the voltage of the upper electrode plate of the first capacitor C1 can be VIN.

When the emission control signal EM controls the fifth thin film transistor M5, the sixth thin film transistor M6, and the eighth thin film transistor M8 to be in an on-state, the first power source VDD may apply voltage to the source of the first thin film transistor M1 through the fifth thin film transistor M5. The first thin film transistor M1 can generate current which flows through the light emitting diode D1, so that the light emitting diode D1 can emit light.

In addition, when the emission control signal EM controls the fifth thin film transistor M5 and the eighth thin film transistor M8 to be in an on-state, the first power source VDD may also be connected to the second end of the first capacitor C1 (point A shown in FIG. 1, the upper electrode plate of the first capacitor C1), such that the voltage of the upper electrode plate of the first capacitor C1 is changed from VIN to VDD. Under the action of the first capacitor C1 and the second capacitor C2, the current flowing through the light emitting diode D1 is related to the compensation voltage VIN and the first power source VDD, thus the first power source VDD can be partially compensated, and the influence of the first power source VDD on the current flowing through the light emitting diode D1 can be reduced, thereby reducing the influence of display evenness of the first power source VDD acting to the display device.

In the embodiment of the application, a capacitance value of the first capacitor C1 may be greater than ten times the capacitance value of the second capacitor C2. Preferably, the ratio of the capacitance value of the first capacitor C1 to the capacitance value of the second capacitor C2 is about 10-100 times. In this way, the influence of the compensation voltage VIN on the current flowing through the light emitting diode D1 can be relatively increased, and the influence of the first power source VDD on the current flowing through the light emitting diode D1 can be relatively reduced, which can effectively improve the display evenness of the display device compared with the prior art.

Figure 2:
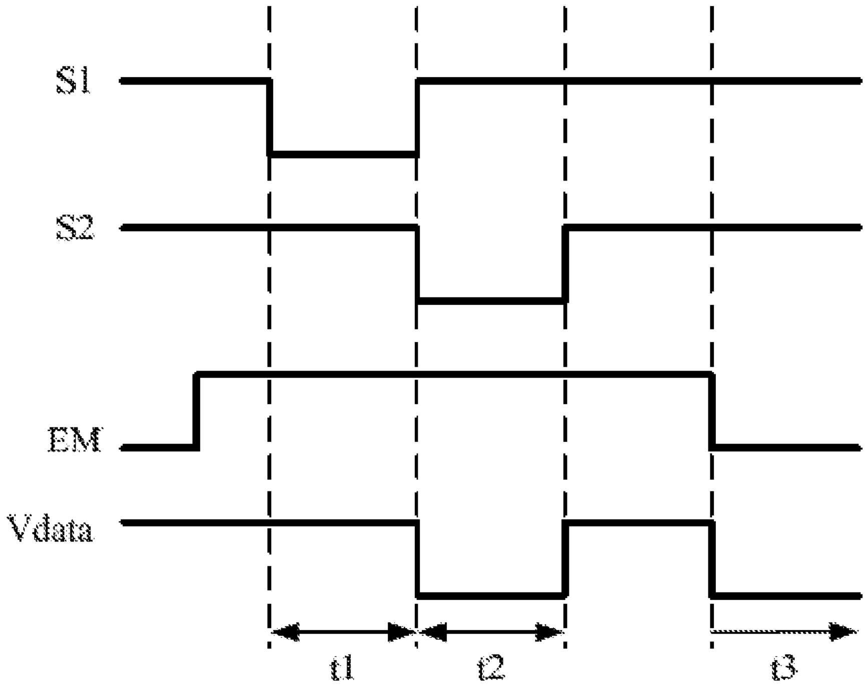
FIG. 2 is a timing diagram of a driving method for a pixel circuit according to an embodiment of the application.

FIG. 2 is a timing diagram of a driving method of a pixel circuit according to an embodiment of the application. The driving method of the pixel circuit may be used to drive a pixel circuit shown in the figures.

The duty cycle in the timing diagram shown in FIG. 2, when driving the pixel circuit shown in FIG. 1, may include three stages: a first stage t1, a second stage t2, and a third stage t3, where S1 is a first scanning signal provided by the first scanning line, and can be used to control the fourth thin film transistor M4 shown in FIG. 1 to be in an on-state or an off-state. S2 is a second scanning signal provided by the second scanning line, and can be used to control the second thin film transistor M2, the third thin film transistor M3, and the seventh thin film transistor M7 to be in an on-state or an off-state. The EM is an emission control signal provided by the emission control line, and can be used to control the fifth thin film transistor M5, the sixth thin film transistor M6, and the eighth thin film transistor M8 shown in FIG. 1 to be in an on-state or an off-state. Vdata is the data voltage provided by the data voltage signal line.

The following three stages will be explained separately:

For the first stage t1:

Since the first scanning signal S1 changes from a high level to a low level, the second scanning signal S2 maintains a high level, and the emission control signal EM changes from a low level to a high level, the fourth thin film transistor M4 is in an on-state, the second thin film transistor M2, the third thin film transistor M3, and the seventh thin film transistor M7 are in an off-state. The fifth thin film transistor M5, the sixth thin film transistor M6 and the eighth thin film transistor M8 are in an off-state.

At this time, the reference voltage VREF applies a voltage to the gate of the first thin film transistor M1, the lower electrode plate of the first capacitor C1, and the right electrode plate of the second capacitor C2 (point B shown in FIG. 2) through the fourth thin film transistor M4, and initialize the gate of the first thin film transistor M1, the lower electrode plate of the first capacitor C1, and the right electrode plate of the second capacitor C2.

After initialization, the gate voltage of the first thin film transistor M1 is equal to VREF, and the voltage of the lower electrode plate of the first capacitor C1 and the voltage of the right electrode plate of the second capacitor C2 are both VREF.

It should be noted that at this time, since the second scanning line S2 is at a high level, the voltage of the left electrode plate (point C shown in FIG. 2) of the second capacitor C2 is at a high level. In practical applications, since the high level voltage of the second scanning line S2 is usually 7V, the voltage of the left electrode plate of the second capacitor C2 may be 7V in the first stage t1.

For the second stage t2:

Since the first scanning signal S1 changes from a low level to a high level, the second scanning signal S2 changes from a high level to a low level, and the emission control signal EM remains at the high level, the fourth thin film transistor M4 changes from the on-state to the off-state, and the second thin film transistor M2, the third thin film transistor M3, and the seventh thin film transistor M7 changes from the off-state to the on-state. The fifth thin film transistor M5, the sixth thin film transistor M6, and the eighth thin film transistor M8 are still in the off-state.

At this time, the gate of the first thin film transistor M1 is connected to the drain of the first thin film transistor M1, and the data voltage Vdata applies voltage to the source of the first thin film transistor M1 through the second thin film transistor M2. At this time, the voltage of the source of the first thin film transistor M1 is Vdata. Since the voltage of the gate of the first thin film transistor M1 is VREF in the first stage t1, the first thin film transistor M1 is in an on-state. The data voltage Vdata is applied to the gate of the first thin film transistor M1 through the first thin film transistor M1 and the third thin film transistor M3, which finally causes the voltage of the gate and the voltage of the drain of the first thin film transistor M1 to be both Vdata−Vth, and the first thin film transistor M1 is in the off-state. Therefore the compensation for the threshold voltage of the first thin film transistor M1 can be realized, wherein Vth is the threshold voltage of the first thin film transistor M1.

For the first capacitor C1, the compensation voltage VIN applies a voltage to the upper electrode plate of the first capacitor C1 through the seventh thin film transistor M7, so that the voltage of the upper electrode plate of the first capacitor C1 turns to VIN. At this time, since the voltage of the lower electrode plate of the first capacitor C1 is equal to the voltage of the gate of the first thin film transistor M1, the voltage of the lower electrode plate of the first capacitor C1 is Vdata−Vth, and the voltage difference between the lower electrode plate and the upper electrode plate of the first capacitor C1 is Vdata−Vth−VIN.

For the second capacitor C2, the voltage of the right electrode plate of the second capacitor C2 is equal to the voltage of the lower electrode plate of the first capacitor C1, that is, Vdata−Vth, and the voltage of the left electrode plate is equal to the low level provided by the second scanning line S2. In practical applications, since the low level provided by the second scanning line S2 is usually −7V, the voltage of the left electrode plate of the second capacitor C2 turns to −7V, and the voltage difference between the left and right electrode plates of the second capacitor C2 is −7−Vdata+Vth.

For the third stage t3:

Since the first scanning signal S1 is kept at a high level, the second scanning signal S2 changes from a low level to a high level, and the emission control signal EM changes from a high level to a low level, the fourth thin film transistor M4 is still in the off-state, and the second thin film transistor M2, the third thin film transistor M3, and the seventh thin film transistor M7 turn from the on-state to the off-state. The fifth thin film transistor M5, the sixth thin film transistor M6, and the eighth thin film transistor M8 turn from the off-state to the on-state.

At this time, the first power source VDD applies a voltage to the upper electrode plate of the first capacitor C1 through the fifth thin film transistor M5 and the eighth thin film transistor M8, so that the voltage of the upper electrode plate of the first capacitor C1 changes from VIN to VDD. Meanwhile, the second scanning line S2 changes from a low level to a high level, so that the voltage of the left electrode plate of the second capacitor C2 changes from −7V to 7V. At this stage, due to a series connection of the first capacitor C1 and the second capacitor C2, a variation VDD-VIN in the voltage of the upper electrode plate of the first capacitor C1 brings a variation $$\frac{c1}{c1+c2}(VDD-VIN)$$

in the voltage of the lower electrode plate of the first capacitor C1, and a variation 14V in the voltage of the left electrode plate of the second capacitor C2 brings a variation $$\frac{c2*14}{c1+c2}$$

to the voltage of the lower electrode plate of the first capacitor C1. Therefore the voltage of the lower electrode plate of the first capacitor C1, that is, the voltage of the right electrode plate of the second capacitor C2 changes from Vdata−Vth to $$Vdata-Vth+\frac{c1}{c1+c2}(VDD-VIN)+\frac{c2*14}{c1+c2},$$

where c1 is a capacitance value of the first capacitor C1, c2 is a capacitance value of the second capacitor C2.

In the third stage t3, the first thin film transistor M1 is turned on, the current flows through the light emitting diode D1 which emits light. The current flowing through the LED D1 can be expressed as:

$$I_{OLED}=\mu C_{ox}\frac{W}{2L}(V_{gs}-Vth)^2=\mu C_{ox}\frac{W}{2L}(V_s-V_g-Vth)^2=\mu C_{ox}\frac{W}{2L}\left(\frac{c2*VDD+c1*VIN-c2*14}{c1+c2}-Vdata\right)^2$$

Wherein, μ is an electron mobility of the first thin film transistor M1, $C_{ox}$ is a gate oxide layer capacitance per unit area of the first thin film transistor M1, and W/L is a breadth length ratio of the first thin film transistor M1.

It can be seen from the above formula that the current flowing through the light emitting diode D1 is related to the compensation voltage VIN and the first power source VDD, and is independent from the threshold voltage of the first thin film transistor M1, thus the partial compensation of the first power source VDD can be achieved, thereby reducing the influence of the supply voltage drop of the first power source VDD on the display effect and increasing the display evenness of the display device to a certain extent. Meanwhile, the compensation to the threshold voltage of the first thin film transistor M1 can be realized, and the display unevenness of the display device caused by the difference in threshold value of the first thin film transistor M1 can be avoided.

It should be noted that, in the embodiment of the application, the capacitance value of the first capacitor C1 may be greater than ten times of the capacitance value of the second capacitor C2, preferably, The ratio between the capacitance value of the first capacitor C1 and the capacitance value of the second capacitor C2 is about 10 to 100 times. Thus, the influence of the first power source VDD on the $I_{OLED}$ will be less than the influence of the compensation voltage VIN on the $I_{OLED}$, so that even if the first power source VDD has a larger supply voltage drop, the influence of the first power supply VDD on the display evenness of the display device is also relatively small, as the influence of the first power source VDD on the $I_{OLED}$ is relatively small, thereby achieving partial compensation to the first power source VDD, and improving the display effect of the display device. In practical applications, the influence of the first power source VDD and the compensation voltage VIN on the $I_{OLED}$ can also be changed by changing the capacitances of the first capacitor C1 and the second capacitor C2.

It should also be noted that in practical applications, the compensation voltage VIN also has a certain voltage drop. However, since the compensation voltage VIN only needs to charge the first capacitor C1 and does not participate in driving the pixel circuit, the current generated by the compensation voltage VIN is much smaller than the current generated by the first power source VDD, and the resulting voltage drop generated by the compensation voltage VIN is also much smaller than the voltage drop generated by the first power source VDD. That is, in the embodiment of the application, the current flowing through the light emitting diode D1 is determined by the compensation voltage VIN and the first power source VDD. The display unevenness of the display device caused by the supply voltage drop can be effectively improved.

In the pixel circuit provided by the embodiment of the application, the compensation voltage provided by the compensation voltage signal line can partially compensate the supply voltage during the emission stage of the pixel circuit, so that the current flowing through the light emitting diode is determined by both the compensation voltage and the supply voltage. The influence of the supply voltage drop on the current flowing through the light emitting diode can be further reduced to a certain extent, thereby reducing the influence of the supply voltage drop on the display unevenness of the display device.

In addition, the pixel circuit provided by the embodiment of the application can further compensate the threshold voltage of the driving thin film transistor, thus the problem that the display unevenness of the display device due to the difference in threshold voltage of the driving thin film transistor can be effectively avoided.

The embodiment of the application further provides a display device which may include the pixel circuit described above.

It will be apparent to a person skilled in the art that although the preferred embodiments of the application have been described, the further modifications and variations can be made to the embodiments once a person skilled in the art learns the basic initiative concept; Therefore, the appended claims are intended to be interpreted as including the preferred embodiments and all of the modifications and variations falling into the protection scope of the application.

It will be apparent to a person skilled in the art that various modifications and variations can be made to the application without departing from the scope of the application. Thus, it is intended that the present application covers the modifications and variations as long as the modifications and variations made to the application belong to the protection scope of the appended claims and the equivalent technology thereof of the application.

What is claimed is:

1. A pixel circuit comprising:

a first thin film transistor, a second thin film transistor, a third thin film transistor, a fourth thin film transistor, a fifth thin film transistor, a sixth thin film transistor, a seventh thin film transistor, an eighth thin film transistor, a first capacitor, a second capacitor, and a light emitting diode, wherein a gate of the first thin film transistor is respectively connected to a source of the third thin film transistor, a source of the fourth thin film transistor, a first end of the first capacitor and a first end of the second capacitor; a drain of the fourth thin film transistor is connected to a reference voltage signal line; a second end of the first capacitor is respectively connected to a drain of the seventh thin film transistor and a drain of the eighth thin film transistor; a source of the seventh thin film transistor is connected to a compensation voltage signal line, and a second end of the second capacitor is connected to a control signal line;

a source of the first thin film transistor is respectively connected to a drain of the second thin film transistor, a drain of the fifth thin film transistor, and a source of the eighth thin film transistor; a source of the second thin film transistor is connected to a data voltage signal line, and a source of the fifth thin film transistor is connected to a first power source; and a drain of the first thin film transistor is respectively connected to a drain of the third thin film transistor and a source of the sixth thin film transistor; a drain of the sixth thin film transistor is connected to an anode of the light emitting diode, and a cathode of the light emitting diode is connected to a second power source.

2. The pixel circuit according to claim 1, wherein the first power source supplies a supply voltage to the first thin film transistor; and a current flows into the second power source when the light emitting diode emits light.

3. The pixel circuit according to claim 2, wherein the reference voltage signal line provides a reference voltage, the reference voltage is a negative voltage initializing the gate of the first thin film transistor;

the control signal line provides a control signal, the control signal provides an alternating voltage changing a voltage of the second end of the second capacitor.

4. The pixel circuit according to claim 3, wherein the compensation voltage signal line provides a compensation voltage for partially compensating the supply voltage provided by the first power source.

5. The pixel circuit according to claim 4, wherein the compensation voltage is a positive voltage greater than the supply voltage provided by the first power source; or the compensation voltage is a negative voltage, and the compensation voltage and the reference voltage provided by the reference signal line are provided by a same power source.

6. The pixel circuit according to claim 5, wherein a gate of the fourth thin film transistor is connected to a first scanning line, and the first scanning line provides a first scanning signal controlling the fourth thin film transistor to be in an on-state, and initializing the gate of the first thin film transistor;

a gate of the second thin film transistor, a gate of the third thin film transistor, and a gate of the seventh thin film transistor are connected to a second scanning line, and the second scanning line provides a second scanning signal controlling the second thin film transistor, the third thin film transistor, and the seventh thin film transistor to be in an on-state, and compensating a threshold voltage of the first thin film transistor;

a gate of the fifth thin film transistor, a gate of the sixth thin film transistor, and a gate of the eighth thin film transistor are connected to an emission control line, and the emission control line provides an emission control signal controlling the fifth thin film transistor, the sixth thin film transistor, and the eighth thin film transistor to be in an on-state, the current flows through the light emitting diode.

7. The pixel circuit according to claim 6, wherein when the second scanning signal controls the seventh thin film transistor to be in an on-state, the compensation voltage signal line is connected to the second end of the first capacitor, and the compensation voltage applies a voltage to the first capacitor; and when the light emitting control signal controls the fifth thin film transistor and the eighth thin film transistor to be in an on-state, the first power source is connected to the second end of the first capacitor through the fifth thin film transistor and the eighth thin film transistor; under an action of the first capacitor and the second capacitor, a voltage flowing through the light emitting diode is related to the compensation voltage and the first power source, and partially compensate the first power source.

8. The pixel circuit according to claim 7, wherein the control signal line connected to the second end of the second capacitor is the second scanning line.

9. The pixel circuit according to claim 8, wherein a capacitance value of the first capacitor is greater than a capacitance value of the second capacitor.

10. The pixel circuit according to claim 9, wherein the capacitance value of the first capacitor is between ten times and one hundred times of the capacitance value of the second capacitor.

11. The pixel circuit of claim 1 wherein the first thin film transistor is a P-type thin film transistor.

12. The pixel circuit according to claim 11, wherein the second thin film transistor, the third thin film transistor, the fourth thin film transistor, the fifth thin film transistor, the sixth thin film transistor, the seventh thin film transistor, and the eighth thin film transistor are all N-type thin film transistors or all P-type thin film transistors.

13. The pixel circuit according to claim 11, wherein at least one of the second thin film transistor, the third thin film transistor, the fourth thin film transistor, the fifth thin film transistor, the sixth thin film transistor, the seventh thin film transistor, and the eighth thin film transistor is a P-type thin film transistor.

14. A pixel circuit driving method, comprising:

in a first stage, a first scanning signal controlling a fourth thin film transistor to change from an off-state to an on-state, a reference voltage provided by a reference voltage signal line initializing a gate of a first thin film transistor, a first end of a first capacitor, and a first end of a second capacitor, a second scanning signal controlling a second thin film transistor, a third thin film transistor and a seventh thin film transistor to be in an off-state, an emission control signal controlling a fifth thin film transistor, a sixth thin film transistor, and an eighth thin film transistor to be in an off-state, and applying by a control signal line a high level to a second end of the second capacitor;

in a second stage, the first scanning signal controlling the fourth thin film transistor to change from the on-state to the off-state, the second scanning signal controlling the second thin film transistor, the third thin film transistor, and the seven thin film transistor to change from the off-state to the on-state, and compensating for a threshold voltage of the first thin film transistor, a compensation voltage provided by a compensation voltage signal line applying a voltage to a second end of the first capacitor; the emission control signal controlling the fifth thin film transistor, the sixth thin film transistor and the eighth thin film transistor to be in the off-state, and applying by the control signal line a low level to the second end of the second capacitor; and in a third stage, the first scanning signal controlling the fourth thin film transistor to be in the off-state, the second scanning signal controlling the second thin film transistor, the third thin film transistor, and the seventh thin film transistor to change from the on-state to the off-state, the emission control signal controlling the fifth thin film transistor, the sixth thin film transistor, and the eighth thin film transistor to change from the off-state to the on-state, wherein, the light emitting diode emits light, and the control signal line applies a high level to the second end of the second capacitor.

15. The driving method according to claim 14, wherein in the third stage, under an action of the first capacitor and the second capacitor, a voltage flowing through the light emitting diode is related to the compensation voltage and the first power source, partially compensating the first power source.

16. A display device, comprising the pixel circuit comprising:

a first thin film transistor, a second thin film transistor, a third thin film transistor, a fourth thin film transistor, a fifth thin film transistor, a sixth thin film transistor, a seventh thin film transistor, an eighth thin film transistor, a first capacitor, a second capacitor, and a light emitting diode, wherein a gate of the first thin film transistor is respectively connected to a source of the third thin film transistor, a source of the fourth thin film transistor, a first end of the first capacitor and a first end of the second capacitor; a drain of the fourth thin film transistor is connected to a reference voltage signal line; a second end of the first capacitor is respectively connected to a drain of the seventh thin film transistor and a drain of the eighth thin film transistor; a source of the seventh thin film transistor is connected to a compensation voltage signal line, and a second end of the second capacitor is connected to a control signal line;

a source of the first thin film transistor is respectively connected to a drain of the second thin film transistor, a drain of the fifth thin film transistor, and a source of the eighth thin film transistor; a source of the second thin film transistor is connected to a data voltage signal line, and a source of the fifth thin film transistor is connected to a first power source; and a drain of the first thin film transistor is respectively connected to a drain of the third thin film transistor and a source of the sixth thin film transistor; a drain of the sixth thin film transistor is connected to an anode of the light emitting diode, and a cathode of the light emitting diode is connected to a second power source.

* * * * *